United States Patent
Cheong et al.

(10) Patent No.: US 9,537,507 B2
(45) Date of Patent: Jan. 3, 2017

(54) MONITORING METHOD AND DEVICE OF TWO-CHANNEL BUS DATA IN NETWORK SYSTEM

(71) Applicant: LSIS CO., LTD., Anyang-si, Gyeonggi-do (KR)

(72) Inventors: Jeongyun Cheong, Anyang-si (KR); Jongwook Jeon, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 0 days.

(21) Appl. No.: 14/644,955

(22) Filed: Mar. 11, 2015

(65) Prior Publication Data
US 2015/0263919 A1 Sep. 17, 2015

(30) Foreign Application Priority Data
Mar. 17, 2014 (KR) ........................ 10-2014-0030736

(51) Int. Cl.
| | |
|---|---|
| *H04L 12/00* | (2006.01) |
| *H04L 12/26* | (2006.01) |
| *H03M 13/09* | (2006.01) |
| *H04L 12/40* | (2006.01) |

(52) U.S. Cl.
CPC ........ *H03M 13/09* (2013.01); *H04L 12/40006* (2013.01); *H04L 12/40176* (2013.01); *H04L 2012/4026* (2013.01)

(58) Field of Classification Search
None
See application file for complete search history.

(56) References Cited

U.S. PATENT DOCUMENTS

| | | | | |
|---|---|---|---|---|
| 8,837,494 B2 * | 9/2014 | Feng | ................... | H04L 12/4645 370/395.53 |
| 8,902,922 B2 * | 12/2014 | Soni | .................... | G06F 11/1004 370/419 |
| 2009/0119437 A1 | 5/2009 | Hilscher | | |
| 2014/0156831 A1 * | 6/2014 | Wang | ..................... | H04L 43/12 709/224 |

FOREIGN PATENT DOCUMENTS

EP           1361700          11/2003

OTHER PUBLICATIONS

Yoon, et al., "RAPIEnet based Redundancy Control System," 2011 11th International Conference on Control, Automation and Systems, IEEE, XP032075577, Oct. 2011, pp. 140-145.
European Patent Office Application Serial No. 15159049.4, Search Report dated Aug. 10, 2015, 7 pages.

\* cited by examiner

*Primary Examiner* — Justin R Knapp
(74) *Attorney, Agent, or Firm* — Lee, Hong, Degerman, Kang & Waimey

(57) ABSTRACT

The present disclosure includes: a first channel unit configured to transmit and receive a data piece with a network bus, to convert the received data piece to an MII data piece, and to transmit and receive the converted MII data piece; a second channel unit configured to transmit and receive a data piece with the network bus, to convert the received data piece to an MII data piece, and to transmit and receive the converted MII data piece; a CPU configured to recognize a carrier detection signal (CRC) of the MII data received from the first channel unit and the second channel unit, and to transmit and receive the MII data; and a monitoring unit configured to perform a data communication with the CPU, and to monitor a data piece by each channel from the MII data received from the CPU.

12 Claims, 5 Drawing Sheets

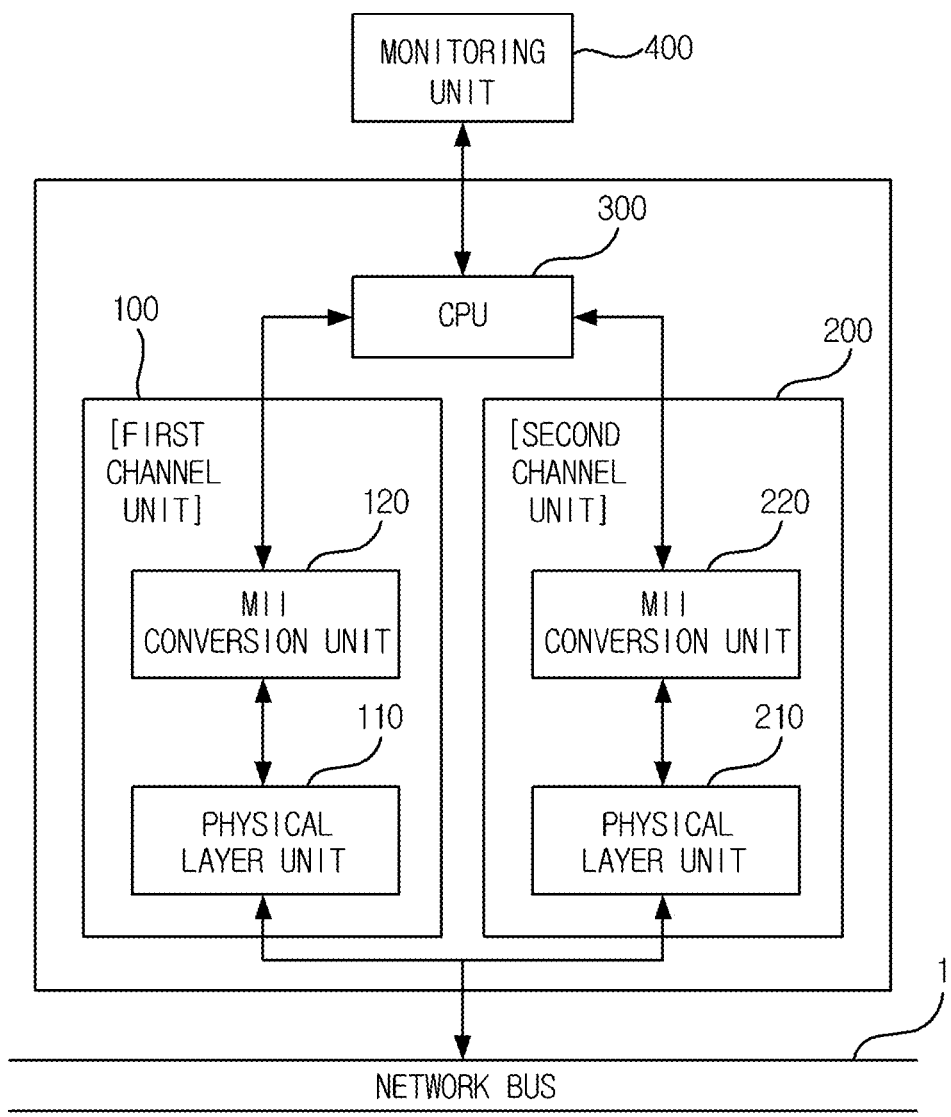

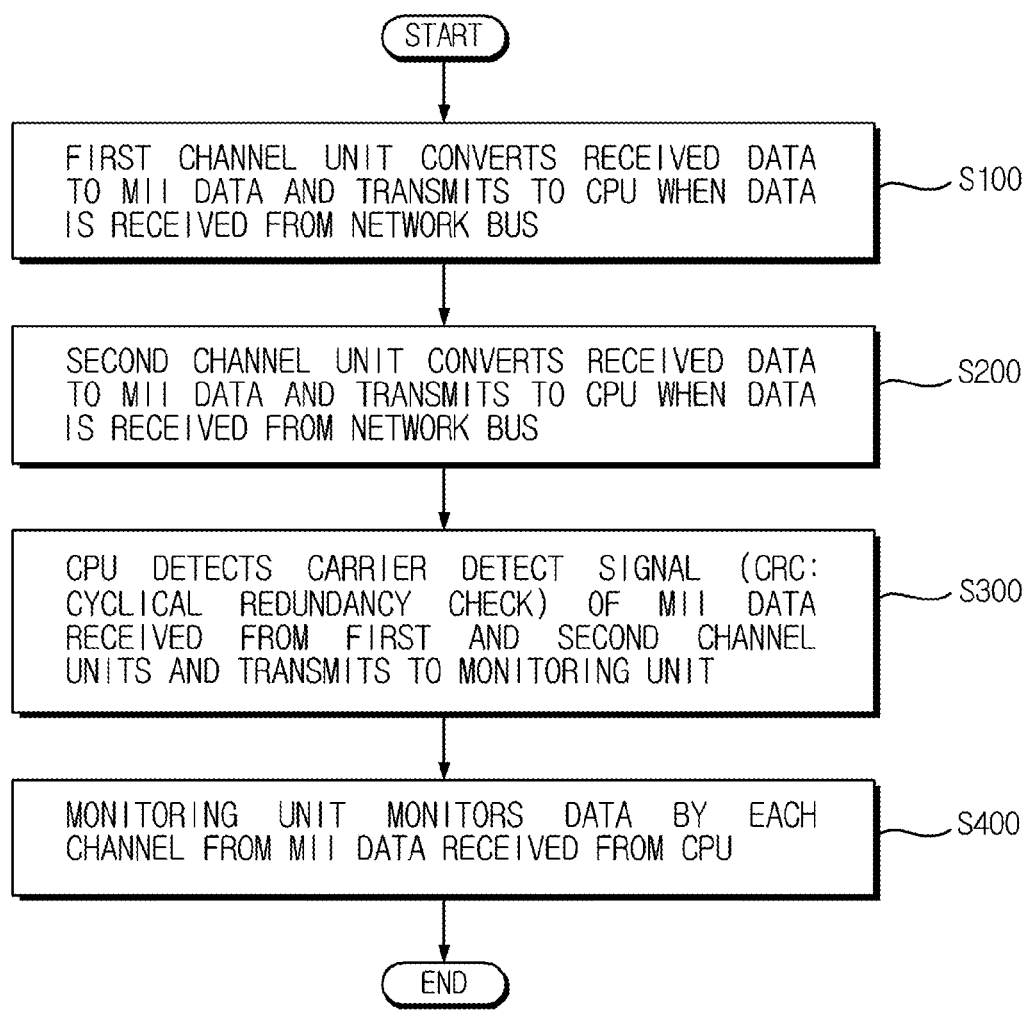

MONITORING METHOD AND DEVICE OF TWO-CHANNEL BUS DATA IN NETWORK SYSTEM

Pursuant to 35 U.S.C. §119(a), this application claims the benefit of earlier filing date and right of priority to Korean Patent Application No. 10-2014-0030736, filed on Mar. 17, 2014, the contents of which are hereby incorporated by reference herein in its entirety.

BACKGROUND

Field of the Disclosure

The present disclosure relates to a monitoring device and a monitoring method of two channel bus data in a RAPIEnet (Real-time Automation Protocols for Industrial Ethernet) network system. More specifically, the present disclosure relates to a monitoring device and a monitoring method of two channel bus data in a RAPIEnet network system which is a technical field applied when using a RAPIEnet communication option development for an iS7 inverter, developed to be applied to a number of reception frames and error frames used as a monitoring/diagnosis function of a communication parameter (COM) group.

Discussion of the Related Art

In general, two Ethernet physical layers are required, according as two channels are used when developing a RAPIEnet communication module. Therefore, communication protocol information delivered from a network delivers MII (Management Independent Interface) data to a CPU in a RAPIEnet communication module through a physical layer, and the CPU detects a carrier detect signal (CRC: Cyclical Redundancy Check) through a converted MII data piece.

FIG. 1 is a view illustrating a conventional bus network system, and FIG. 2 is a functional block diagram illustrating a detailed structure of a communication option card according to FIG. 1.

As illustrated in FIG. 1, in a conventional one-channel network system connecting an inverter to a communication module, a communication option card (20) is installed for communication with a network bus (30), and communication data is transmitted and received through the network bus (30).

In addition, as illustrated in FIG. 2, the communication option card (20) transmits and receives data from outside through the network bus (30), by being formed of a connector (21) and a PHY (physical layer) (22).

The connector (21) of the communication option card (20) transmits and receives data with a CPU (25). Here, received and/or transmitted data delivered through the connector (21) is transmitted through a data connection unit to the PHY (22) which is a physical layer, in order to analyze a communication protocol.

The PHY (22) transmits and receives the received data to MII (Management Independent Interface) data in order to deliver the data delivered from the network bus (30) to the CPU (25).

Meanwhile, the CPU (25) receives the MII (Management Independent Interface) data, processes and converts the data to a CAN communication, and transmits and receives the data with an iS7 inverter (10), by internally recognizing a carrier detection signal (CRC: Cyclical Redundancy Check).

As a result, the data is transmitted to an inverter keypad (11) of FIG. 1, so that the user can check the data by activating a monitoring/diagnosis function.

FIG. 3 is a functional block diagram illustrating a conventional two-channel bus network system. As illustrated in FIG. 3, a two-channel network also communicates in the same process with the one-channel network. A communication option card (20) transmits and receives data from the outside world through the network bus (30). The data is transmitted and received through connectors (21, 24) of the communication option card (20).

Therefore, the received and/or transmitted data delivered through the connectors (21, 24) is transmitted through a data connection unit to the PHYs (22, 23) which are physical layers, respectively, in order to analyze a communication protocol.

In addition, The PHYs (22, 23) transmit and receive the received data to MII (Management Independent Interface) data in order to deliver the data delivered from the network bus (30) to the CPU (25).

Here, the CPU (25) receives the MII (Management Independent Interface) data, processes and converts the data to a CAN communication, and transmits and receives the data with an iS7 inverter (10), by internally recognizing a carrier detection signal (CRC). Such transmitted and/or received data is transmitted to an inverter keypad (11) of the iS7 inverter (10), to show a monitoring/diagnosis function by activating the monitoring/diagnosis function. At this moment, communication parameter (COM) groups such as a number of reception frames (RcvFrame) and a number of error frames (Err Frame Num) are activated by the monitoring/diagnosis function.

Two of physical layers are necessarily required in order to use two channels as a RAPIEnet (Real-time Automation Protocols for Industrial Ethernet) communication option module. Data delivered through the physical layers is processed in a CPU to recognize a carrier detection signal (CRC).

Therefore, it is impossible to find out in which channel, a number of reception frames (RcvFrame) and a number of error frames (Err Frame Num) of a communication parameter group (COM) activating the monitoring/diagnosis function of the inverter through the carrier detection signal (CRC), are generated. Thus, there is a problem that a search for both two channels is required.

SUMMARY OF THE DISCLOSURE

In order to solve out the abovementioned problem, the present disclosure provides a monitoring device and a monitoring method of two channel bus data in a RAPIEnet (Real-time Automation Protocols for Industrial Ethernet) network system. According to an exemplary embodiment of the present disclosure, the RAPIEnet network system may monitor in which channel a number of reception frames (RcvFrame) and a number of error frames (Err Frame Num) of a communication parameter group (COM) activating the monitoring/diagnosis function of the inverter are generated, by using two-channel communication option in order to enforce monitoring/diagnosis function when using the two-channel communication, even when the data delivered through the physical layers is processed in a CPU to recognize a carrier detection signal (CRC).

In a general aspect of the present disclosure, there is provided a monitoring device of two-channel bus data in a RAPIEnet network system, the monitoring device comprising: a first channel unit configured to transmit and receive a data piece with a network bus, to convert the received data piece to an MII (Management Independent Interface) data piece, and to transmit and receive the converted MII data piece; a second channel unit configured to transmit and receive a data piece with the network bus, to convert the received data piece to an MII data piece, and to transmit and receive the converted MII data piece; a CPU configured to recognize a carrier detection signal (CRC: Cyclical Redundancy Check) of the MII data received from the first channel unit and the second channel unit, and to transmit and receive the MII data; and a monitoring unit configured to perform a data communication with the CPU, and to monitor a data piece by each channel from the MII data received from the CPU.

In some exemplary embodiments of the present disclosure, the first and the second channel units may convert the data piece by a unit of a 16-bit word and transmit the converted data piece.

In some exemplary embodiments of the present disclosure, an MII conversion unit of the first channel unit may shift an 8-bit data piece and store a value thereof in upper 8 bits to convert, and an MII conversion unit of the second channel unit may shift an 8-bit data piece and store a value thereof in lower 8 bits to convert.

In some exemplary embodiments of the present disclosure, the monitoring unit may display a number of reception frames or a number of error frames.

In some exemplary embodiments of the present disclosure, the monitoring unit may express from zero (0) to a predetermined threshold value, and may start again counting from zero when a value exceeds the predetermined threshold value.

In some exemplary embodiments of the present disclosure, the number of reception frames of the communication parameter group may be expressed by a total of five digits, by placing a zero between upper two digits and lower two digits, by displaying the number of reception frames or the number of error frames received from the first channel among data received through the network bus at the upper two digits, and by displaying the number of reception frames or the number of error frames received from the second channel among data received through the network bus at the lower two digits.

In another general aspect of the present disclosure, there is provided a monitoring method of two-channel bus data in a RAPIEnet network system, the monitoring method comprising: converting a received data piece, by a first channel unit, to an MII (Management Independent Interface) data piece and transmitting the converted MII data piece to a CPU when the data piece is received from a network bus; converting a received data piece, by a second channel unit, to an MII (Management Independent Interface) data piece and transmitting the converted MII data piece to a CPU when the data piece is received from a network bus; recognizing, by the CPU, a carrier detection signal (CRC: Cyclical Redundancy Check) of the MII data received from the first channel unit and the second channel unit, and transmitting the MII data to a monitoring unit; and monitoring, by the monitoring unit, a data piece by each channel from the MII data received from the CPU.

In some exemplary embodiment of the present disclosure, the steps of converting the received data piece by the first channel unit and converting the received data piece by the second channel unit may include converting the data piece by a unit of a 16-bit word and transmitting the converted data piece.

In some exemplary embodiment of the present disclosure, the step of converting, by the first channel unit, the received data piece to the MII data piece may include shifting an 8-bit data piece and converting a value thereof in upper 8 bits by storing the value thereof in upper 8 bits, and the step of converting, by the second channel unit, the received data piece to the MII data piece may include shifting an 8-bit data piece and converting a value thereof in lower 8 bits by storing the value thereof in lower 8 bits.

In some exemplary embodiment of the present disclosure, the monitoring step may include displaying a number of reception frames or a number of error frames.

In some exemplary embodiment of the present disclosure, the monitoring step may include expressing from zero (0) to a predetermined threshold value, and starting again counting from zero when a value exceeds the predetermined threshold value.

In some exemplary embodiment of the present disclosure, the number of reception frames of the communication parameter group may be expressed by a total of five digits, by placing a zero between upper two digits and lower two digits, by displaying the number of reception frames or the number of error frames received from the first channel among data received through the network bus at the upper two digits, and by displaying the number of reception frames or the number of error frames received from the second channel among data received through the network bus at the lower two digits.

The monitoring device and the monitoring method of two-channel bus data in a RAPIEnet network system according to an exemplary embodiment of the present disclosure may monitor in which channel a number of reception frames (RcvFrame) and a number of error frames (Err Frame Num) of a communication parameter group (COM) activating the monitoring/diagnosis function of the inverter are generated. Thus, there is no need to check both of two channels when a number of error frame (Err Frame Num) is detected in either one of the channels. This provides convenience to the users and has an effect of having more clear and enhanced monitoring/diagnosis function compared to the conventional art.

BRIEF DESCRIPTION OF THE DRAWINGS

FIG. 4 is a functional block diagram illustrating a structure of a monitoring device of two-channel bus data in a RAPIEnet network system according to an exemplary embodiment of the present disclosure.

FIG. 5 is a flow chart illustrating a monitoring method of two-channel bus data in a RAPIEnet network system according to an exemplary embodiment of the present disclosure.

DETAILED DESCRIPTION

Figure 1:
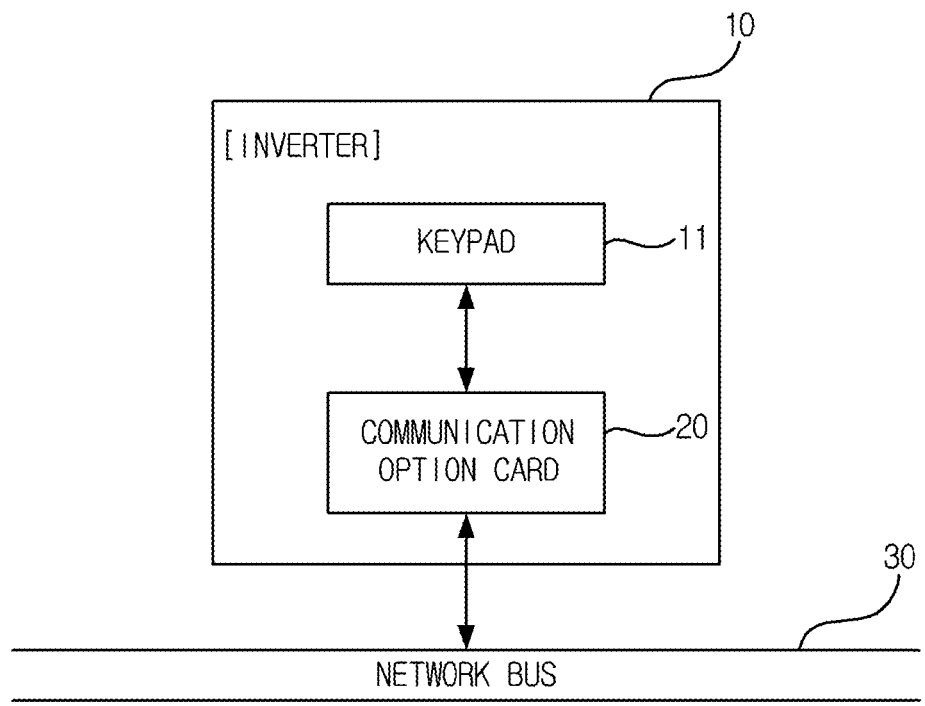
FIG. 1 is a view illustrating a conventional bus network system.
Figure 2:
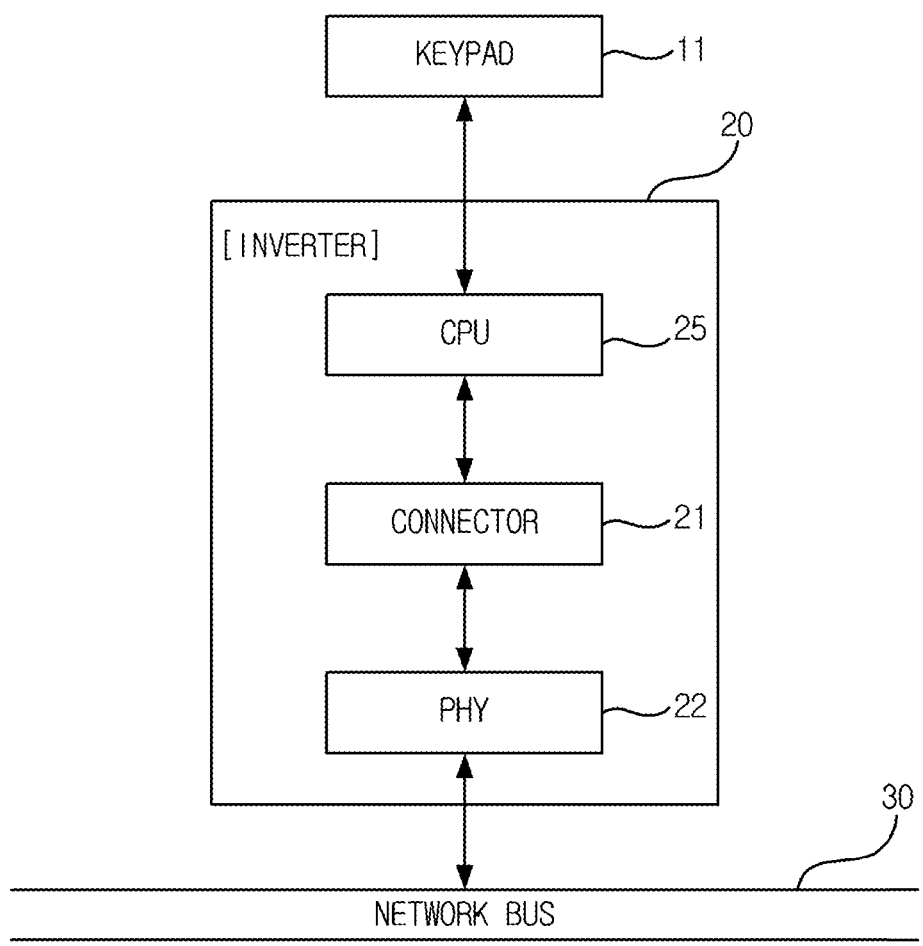
FIG. 2 is a functional block diagram illustrating a detailed structure of a communication option card according to FIG. 1.
Figure 3:
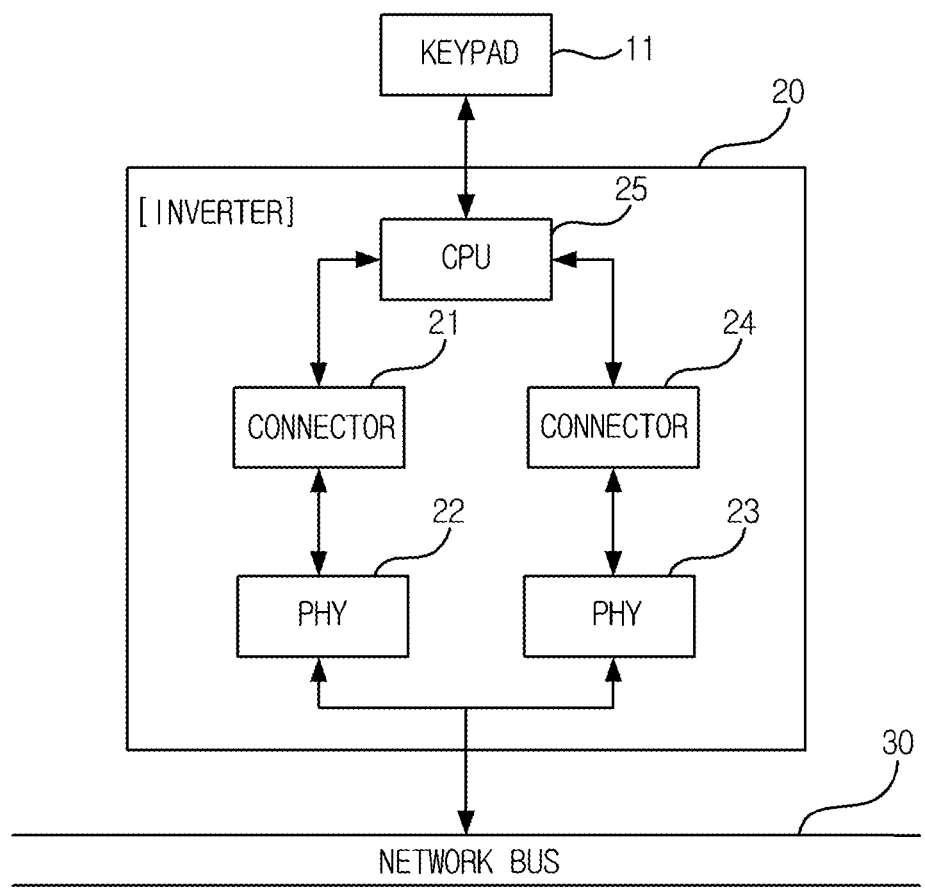
FIG. 3 is a functional block diagram illustrating a conventional two-channel bus network system.

Hereinafter, referring to enclosed figures, a monitoring device and a monitoring method of two-channel bus data in a RAPIEnet network system according to an exemplary embodiment of the present disclosure will be described in detail.

FIG. 4 is a functional block diagram illustrating a structure of a monitoring device of two-channel bus data in a RAPIEnet network system according to an exemplary embodiment of the present disclosure.

As illustrated in FIG. 4, a monitoring device of two-channel bus data in a RAPIEnet network system according to an exemplary embodiment of the present disclosure may be formed by including a first channel unit (100), a second channel unit (200), a CPU (300), and a monitoring unit (400).

The first channel unit (100) may be formed by including a network bus (1), a physical layer unit (110) to transmit and receive data, and an MII conversion unit (120) to convert a data piece received through the physical layer unit (110) to an MII data piece and to transmit the converted MII data piece to a CPU (300).

The first channel unit (100) may be formed by including a network bus (1), a physical layer unit (110) to transmit and receive data, and an MII conversion unit (120) to convert a data piece received through the physical layer unit (110) to an MII data piece and to transmit the converted MII data piece to a CPU (300).

A CPU (300) may recognize a carrier detection signal (CRC: Cyclical Redundancy Check) of the MII data received from the first channel unit (100) and the second channel unit (200), and may transmit and receive the MII data with a monitoring unit (400).

A monitoring unit (400) may perform a data communication with the CPU (300), and may monitor a data piece by each channel from the MII data received from the CPU (300).

Here, MII conversion units (120, 220) of the first channel unit (100) and the second channel unit (200) may convert the data piece by a unit of a 16-bit word and transmit the converted data piece.

Meanwhile, an MII conversion unit (120) of the first channel unit (100) may shift an 8-bit data piece and store a value thereof in upper 8 bits to convert, and an MII conversion unit of the second channel unit shifts an 8-bit data piece and store a value thereof in lower 8 bits to convert.

On the contrary, the monitoring unit (400) may display a number of reception frames or a number of error frames. Here, the monitoring unit (400) may express from zero (0) to a predetermined threshold value, and may start again counting from zero when a value exceeds the predetermined threshold value.

Here, the number of reception frames of the communication parameter group may be expressed by a total of five digits, by placing a zero between upper two digits and lower two digits, by displaying the number of reception frames or the number of error frames received from the first channel among data received through the network bus (1) at the upper two digits, and by displaying the number of reception frames or the number of error frames received from the second channel among data received through the network bus at the lower two digits.

Therefore, according to an exemplary embodiment of the present disclosure, a number of reception frames and a number of error frames may be monitored when using two channels, by limiting the number of reception frames and error frames to 0~64, which was expressed from 0 to 65535 in the conventional art. This has an advantage of enhancing the functionality of diagnosis with respect to the channels.

Hereinafter, referring to FIG. 5, a monitoring method of two-channel bus data in a RAPIEnet network system according to an exemplary embodiment of the present disclosure will be described in detail.

At first, a first channel unit (100) may convert a received data piece to an MII data piece and transmit the converted MII data piece to a CPU, when the data piece is received from a network bus (S100). The step of converting, by the first channel unit (100), the received data piece to the MII data piece (S100) may include shifting an 8-bit data piece and converting a value thereof in upper 8 bits by storing the value thereof in upper 8 bits.

Meanwhile, a second channel unit (200) may convert a received data piece to an MII data piece and transmit the converted MII data piece to a CPU, when the data piece is received from a network bus (S200). The step of converting, by the second channel unit (200), the received data piece to the MII data piece (S200) may include shifting an 8-bit data piece and converting a value thereof in lower 8 bits by storing the value thereof in lower 8 bits.

Here, the steps of converting the received data piece by the first channel unit and converting the received data piece by the second channel unit (S100, S200) may include converting the data piece by a unit of a 16-bit word and transmitting the converted data piece.

Successively, a CPU may recognize a carrier detection signal (CRC) of the MII data received from the first channel unit and the second channel unit, and may transmit the MII data to a monitoring unit (400) (S300).

The monitoring unit (400) may monitor a data piece by each channel from the MII data received from the CPU (S400).

Here, the monitoring step (S400) may include displaying a number of reception frames or a number of error frames. In addition, the monitoring step (400) may include expressing from zero (0) to a predetermined threshold value, and starting again counting from zero when a value exceeds the predetermined threshold value.

Here, the number of reception frames of the communication parameter group may be expressed by a total of five digits, by placing a zero between upper two digits and lower two digits, by displaying the number of reception frames or the number of error frames received from the first channel among data received through the network bus at the upper two digits, and by displaying the number of reception frames or the number of error frames received from the second channel among data received through the network bus at the lower two digits.

The abovementioned exemplary embodiments are intended to be illustrative, and not to limit the scope of the claims. Many alternatives, modifications, variations, and equivalents will be apparent to those skilled in the art. The features, structures, methods, and other characteristics of the exemplary embodiments described herein may be combined in various ways to obtain additional and/or alternative exemplary embodiments. Therefore, the technical scope of the rights for the present disclosure shall be decided by the claims.

REFERENCE NUMERALS 100 first channel unit
200 second channel unit
300 CPU
400 monitoring unit

What is claimed is:

1. A device for monitoring two channel bus data in a RAPIEnet (Real-time Automation Protocols for Industrial Ethernet) network system, the monitoring device comprising:
    a first channel unit configured to receive a first data piece from a network bus, to convert the received first data piece to a converted first MII (Management Independent Interface) data piece, and to transmit the converted first MII data piece to a CPU;

a second channel unit configured to receive a second data piece from the network bus, to convert the received second data piece a converted second MII data piece, and to transmit the converted second MII data piece to the CPU; and a monitoring unit configured to receive the converted first and second MII data piece from the CPU and to monitor the first and second data piece based on the received converted first and second MII data piece, wherein the first channel unit converts the first data piece in units of a 16-bit word, and wherein the second channel unit converts the second data piece in units of a 16-bit word.

2. The monitoring device of claim 1, wherein:

the first channel unit comprises an MII conversion unit configured to shift an 8-bit data portion of the first data piece and store the converted 8-bit data portion as upper 8 bits to convert; and the second channel unit comprises an MII conversion unit configured to shift an 8-bit data portion of the second data piece and store the converted 8-bit data portion as lower 8 bits to convert.

3. The monitoring device of claim 1, wherein the monitoring unit is further configured to display a number of reception frames or a number of error frames.

4. The monitoring device of claim 3, wherein a number of reception frames in a communication parameter group is expressed as five digits by:

placing a zero between an upper two digits and a lower two digits;

displaying a number of reception frames or a number of error frames received from the first channel among data received via the network bus as the upper two digits; and displaying a number of reception frames or a number of error frames received from the second channel among data received via the network bus as the lower two digits.

5. The monitoring device of claim 1, wherein monitoring each of the first and second data piece comprises expressing from zero to a predetermined threshold value and again counting from zero when a corresponding value exceeds the predetermined threshold value.

6. The monitoring device of claim 1, wherein the CPU recognizes a carrier detection signal of the converted first and second MII data piece and transmits the converted first and second MII data piece to the monitoring unit.

7. A method of monitoring two-channel bus data in a RAPIEnet (Real-time Automation Protocols for Industrial Ethernet) network system, the monitoring method comprising:

receiving a first data piece from a network bus, converting the received first data piece to a converted first MII (Management Independent Interface) data piece and transmitting the converted first MII data piece to a CPU;

receiving a second data piece from a network bus, converting the received second data piece to a second MII data piece and transmitting the converted second MII data piece to the CPU second; and receiving the converted first and second MII data piece from the CPU and monitoring the first and second data piece based on the received converted first and second MII data piece, wherein the first data piece and the second data piece are converted in units of a 16-bit word.

8. The monitoring method of claim 7, wherein converting the first data piece to the first MII data piece comprises shifting an 8-bit data portion of the first data piece and storing the converted 8-bit data portion as upper 8 bits to convert; and converting the second data piece to the second MII data piece comprises shifting an 8-bit data portion of the second data piece and storing the converted 8-bit data portion as lower 8 bits to convert.

9. The monitoring method of claim 7, further comprising displaying a number of reception frames or a number of error frames.

10. The monitoring method of claim 9, wherein a number of reception frames of a communication parameter group is expressed as five digits by:

placing a zero between an upper two digits and a lower two digits;

displaying a number of reception frames or a number of error frames received from a first channel among data received via the network bus as the upper two digits; and displaying a number of reception frames or a number of error frames received from a second channel among data received via the network bus as the lower two digits.

11. The monitoring method of claim 7, wherein monitoring each of the first and second data piece comprises expressing from zero to a predetermined threshold value and again counting from zero when a value exceeds the predetermined threshold value.

12. The monitoring method of claim 7, wherein the CPU recognizes a carrier detection signal of the converted first and second MII data piece and transmits the converted first and second MII data piece.

* * * * *